United States Patent [19]

Knapp et al.

[11] Patent Number: 5,182,071
[45] Date of Patent: Jan. 26, 1993

[54] METHOD OF MOLDING A CARRIER RING TO LEADS

[75] Inventors: James H. Knapp, Gilbert; Keith E. Nelson, Tempe, both of Ariz.

[73] Assignee: Motorola, Inc., Schaumburg, Ill.

[21] Appl. No.: 627,526

[22] Filed: Dec. 14, 1990

[51] Int. Cl.⁵ .................... B29C 45/02; B29C 45/58
[52] U.S. Cl. .................... 264/272.13; 264/272.17; 264/328.4; 264/328.5; 264/328.12; 425/544
[58] Field of Search ............ 264/272.13, 272.17, 264/328.4, 328.5, 328.12; 425/544

[56] References Cited

U.S. PATENT DOCUMENTS

| | | | |
|---|---|---|---|
| 3,989,793 | 11/1976 | Hertel et al. | 264/328.4 |
| 4,006,210 | 2/1977 | Denton | 264/328.12 |
| 4,554,126 | 11/1985 | Sera | 264/272.17 |
| 4,708,613 | 11/1987 | Sera et al. | 425/544 |
| 4,837,187 | 6/1989 | Lin et al. | 264/272.11 |

OTHER PUBLICATIONS

Dictionary of Plastics, Wordingham, J. Author, Hamlyn Publishing Group Ltd., Co. 1968, pp. 10 and 65.

*Primary Examiner*—Jan H. Silbaugh
*Assistant Examiner*—Angela Ortiz

[57] ABSTRACT

Molding carrier structures to leads of existing semiconductor packages is accomplished by molding at temperatures which maintain approximately matched thermal expansion between an encapsulating material and leads of the semiconductor package. The matched thermal expansion is provided by molding at temperatures below that which is required for glass transition of the encapsulating material. Molding at such temperatures is facilitated by a molding assembly that has a molding pot with an irregular shaped bottom which fluidizes the encapsulating material at low temperatures. Molding at temperatures that essentially match thermal expansion between the package's leads and the encapsulating material prevents damaging the leads of the package.

12 Claims, 2 Drawing Sheets

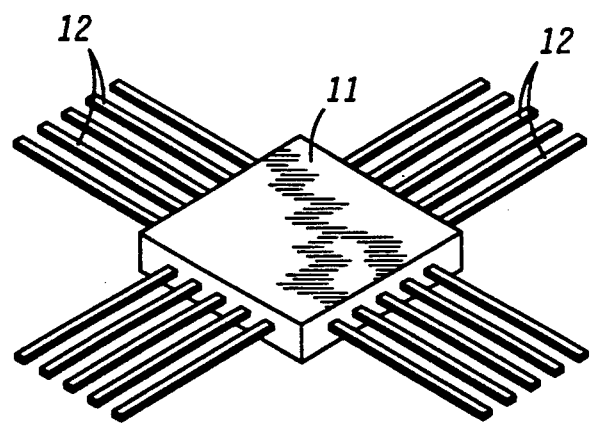
FIG. 1
FIG. 2
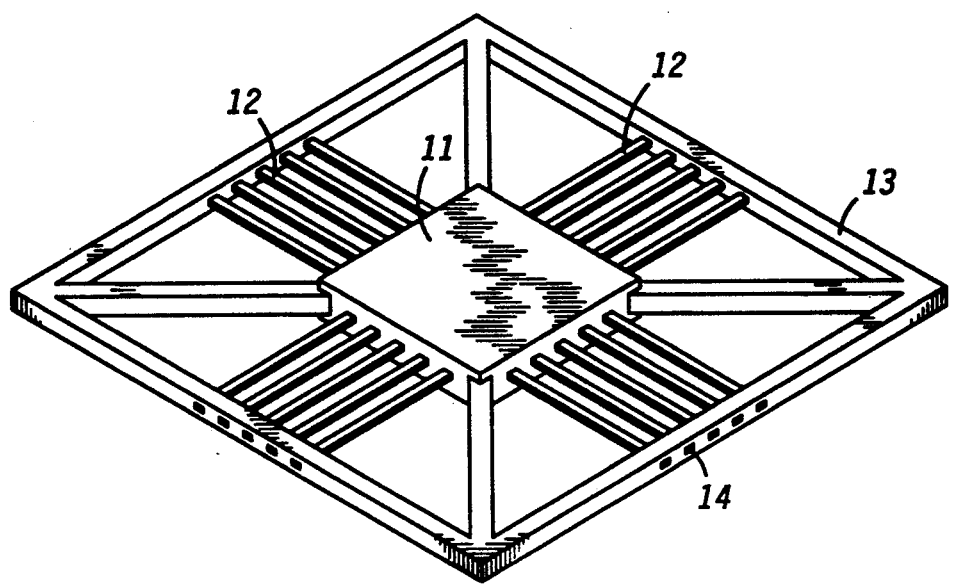

METHOD OF MOLDING A CARRIER RING TO LEADS

BACKGROUND OF THE INVENTION

The present invention relates, in general, to molding semiconductor packages, and more particularly, to a novel method for molding carrier structures to leads of existing semiconductor packages.

Peripheral carrier structures, or carrier rings had been used by the industry as a protective mechanism for semiconductor packages. Carrier structures prevented damage to leads of a semiconductor package during assembly, test, burn-in, and other phases of semiconductor manufacturing. These carrier structures or carrier rings were strips of plastic or other similar material that encapsulated the ends of the leads of semiconductor packages. Typically the carrier structure was used on high pin count packages that had flat bodies and a rectangular or square shape with leads extending out from all four sides of the package. Generally, carrier rings were molded onto the leads simultaneously with the molding of the plastic body of the package. Attempts to mold carrier rings to semiconductor packages that were previously assembled resulted in bending and distorting the leads of the semiconductor packages. Consequently, semiconductor packages without molded bodies such as ceramic packages, and packages without bodies such as tape automated bonding (TAB) packages, generally used a two piece carrier ring. Typically, an adhesive was used to attach the two piece carrier ring to the leads of the package. During attachment of the two piece ring, some of the leads of the package usually were damaged. Materials for the two piece carrier ring were much more expensive than materials for the molded carrier ring and the process of attaching the two piece carrier ring was also more expensive than the molding process. Consequently, two piece carrier rings were not well accepted by the industry.

Accordingly, it would be desirable to have a method of applying a carrier ring to an assembled semiconductor package that does not damage the leads of the package, and that has a low manufacturing cost.

SUMMARY OF THE INVENTION

Briefly stated, the present invention is achieved by molding a carrier structure to an existing semiconductor package. The carrier structure is molded at temperatures which maintain approximately matched thermal expansion between encapsulating material and an object to be encapsulated. The matched thermal expansion is provided by molding at temperatures below the encapsulating material's glass transition temperature. Molding at such temperatures is facilitated by a molding assembly that has a molding pot with an irregular shaped bottom which fluidizes the encapsulating material at low temperatures.

BRIEF DESCRIPTION OF THE DRAWINGS

FIG. 1 is an isometric view of an assembled semiconductor package;

FIG. 2 is the package of FIG. 1 after a carrier structure has been attached to the package in accordance with the present invention;

DETAILED DESCRIPTION OF THE DRAWINGS

Figure 3:
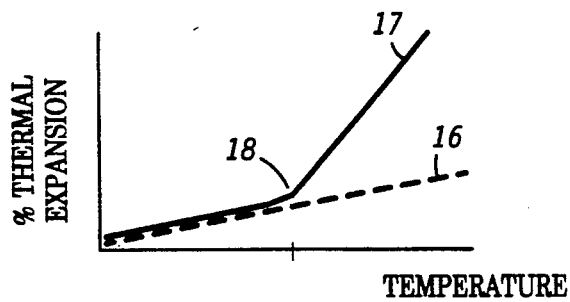
FIG. 3 is a graph showing thermal expansion verses temperature in accordance with the present invention.

The present invention provides a method for molding to a previously assembled semiconductor package. Molding is performed at temperatures lower than a molding compound or encapsulating material's glass transition temperature so that thermal expansion of the encapsulating material is closely matched to thermal expansion of the leads of the assembled semiconductor package. A molding assembly used for the molding has a molding pot with an irregular shaped bottom that facilitates molding at low temperatures. The irregular shaped bottom of the pot is formed by projections extending upward from the bottom of the pot.

While the invention is described with specific preferred embodiments, it is evident that many alternatives and variations will be apparent to those skilled in the art. More specifically the invention has been described for a particular semiconductor package, molding assembly, and molding pot although the method is directly applicable to other semiconductor packages, as well as to other molding assemblies, molding pots, and shapes extending from the bottom of the molding pot.

FIG. 1 represents an assembled semiconductor package 10, having a body 11 and leads 12, to which a carrier structure or carrier ring will be applied. The number of leads 12 shown in FIG. 1 have been limited for simplicity of the figure, but it is understood that package 10 may be a VLSI package having up to 200 or more leads 12. Package 10 can be one of many different types of packages that contain a semiconductor die such as a package with a ceramic body 11, a tape automated bonding (TAB) package that may not have body 11, a plastic package with a molded body 11, or other various forms of semiconductor packages.

FIG. 2 represents package 10 of FIG. 1 after a carrier structure 13 has been molded to distal ends 14 of leads 12. Using conventional molding techniques to mold carrier structure 13 to leads 12 can cause severe damage to leads 12. The damage results from leads 12 having different thermal expansion and contraction rates than the encapsulating material used for carrier structure 13.

FIG. 3 shows percent thermal expansion of leads 12 in graph 16, and percent thermal expansion of the encapsulating material used for carrier structure 13 in graph 17. The graphs show expansion, expressed as a per cent of the original length of the material, over a range of temperatures. As shown in graph 16, leads 12 expand at a linear rate with temperature. Point 18 represents a glass transition temperature for the encapsulating material. The glass transition temperature of a material is a temperature above which there are abrupt changes in the material's properties, such as thermal expansion, elasticity, density, viscosity, etc. Graph 17 shows two different expansion rates for the encapsulation material used for carrier ring 13. Below glass transition temperature 18 of the encapsulation material, the expansion rate is approximately equal to the expansion rate of leads 12. But, above glass transition temperature 18 the encapsulation material expands more than leads 12. If leads 12 and the encapsulation material are both heated above glass transition temperature 18, the encapsulation material expands more than leads 12. When both are cooled, the encapsulation material contracts more than leads 12. This unequal contraction applies pressure to leads 12 causing bending and distortion in the section of leads 12 that is between carrier structure 13 and body 11.

It has been found that molding carrier structure 13 to package 10 at temperatures below glass transition temperature 18, permits both materials to expand and contract equally. Consequently, pressure is not applied to leads 12 during cooling and leads 12 are not damaged.

Figure 4:
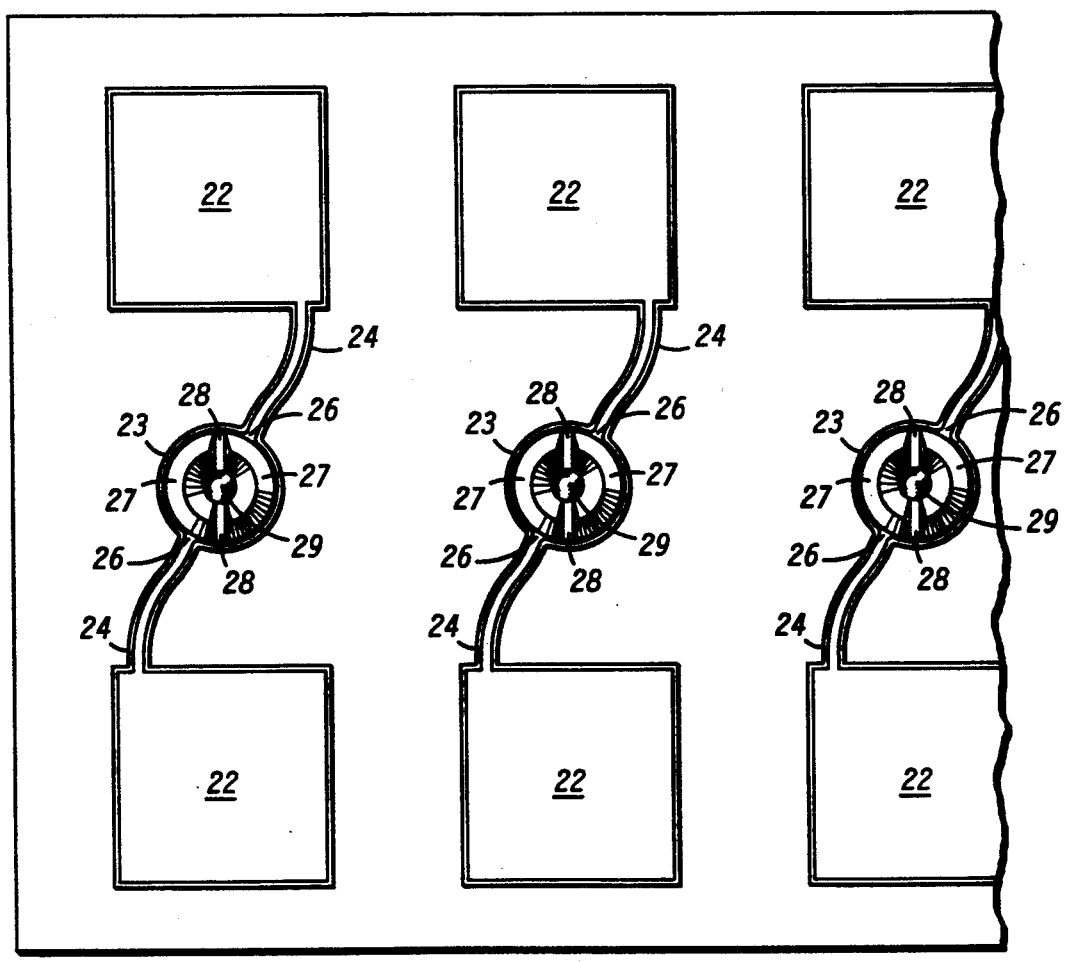
FIG. 4 is a plan view of a portion of a mold assembly useful in practicing the present invention.

Referring to FIG. 4, a portion of a particular configuration of a multi-pot mold assembly 21, that provides for molding below glass transition temperature 18 shown in FIG. 3, includes molding cavities 22, molding pots 23, and chases or runners 24. The particular configuration is shown for the convenience of explanation, consequently, the number and configuration of cavities 22, pots 23, and runners 24 can vary from the configuration that is shown. Typically, encapsulation material is placed in molding pots 23. Mold assembly 21 is heated, and pressure is applied to fluidize the encapsulating material causing it to flow through runners 24 into cavities 22. Typically, a conventional multi-pot molding assembly fluidized the encapsulating material by heating the molding assembly above the encapsulating material's glass transition temperature, usually between 160 to 190 degrees centigrade, and applying pressure of approximately 80 Kg/cm$^2$. Below glass transition temperature 18 of FIG. 3, the encapsulation material's viscosity is too high for standard mold assemblies.

It has been found that a molding pot with an irregular bottom fluidizes encapsulating material at temperatures below the encapsulating material's glass transition temperature, thereby permitting encapsulation of portions of semiconductor packages without damaging the package or the leads of the package. Projections extending upward from the bottom of molding pot 23 form the irregular bottom and facilitate molding at low temperatures. The projections have a slot 28 that guides fluidized encapsulating material from pot 23 through an opening 26 to chase or runner 24. Slot 28 is oriented away from opening 26 so that only mostly fluidized encapsulating material reaches opening 26.

Figure 5:
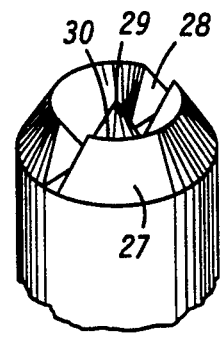
FIG. 5 is an isometric view of an irregular shaped bottom of a molding pot used in the mold assembly of FIG. 4.

Referring to FIG. 5, a particular configuration of the irregular bottom of molding pot 23 has a cylindrical portion 27 extending from the bottom of pot 23, and a vertex of a cone shaped portion 29 in the center of cylindrical portion 27. Cylindrical portion 27 has sides that taper to form peak or edge 30 at the peak of cylindrical projection 27. Slots 28 provide a passage for fluidized encapsulation material to flow away from molding pot 23. In normal operation, encapsulating material is placed inside of pot 23 of FIG. 4 and pressure is applied to the encapsulating material pressing it onto projections 27 and 29. The tapered shapes provide increased surface area and increased pressure at the point of contact with the encapsulating material, thereby fluidizing the encapsulating material at low temperatures. In the preferred embodiment, mold assembly 21 is preheated to approximately 125 degrees centigrade, then a pressure of nine Kg/cm$^2$ is applied to fluidize an Al$_2$O$_3$ filled novolac type epoxy which encapsulates distal ends 14 of leads 12. Epoxies in the novolac family of epoxies generally have a glass transition temperature above 150 degrees centigrade. Other shapes could be used for projections 27 and 29, as long as the projections have a slot for guiding the fluidized material, and are tapered to a point to provide increased surface area and increased pressure at their peaks. A series of pyramid shapes is another suitable shape for the irregular shaped bottom of pot 23.

Since the molding is performed at low temperatures, molding can be performed on plated leads without forming detrimental intermetallic compounds on the leads. Therefore, leads 12 may be plated with gold, tin, tin-lead solder, or other materials.

By now it should be appreciated that there has been provided a novel way to mold carrier structures to existing semiconductor packages. The method of molding at temperatures below the glass transition temperature of the encapsulating material provides an inexpensive method of molding to existing packages without damaging the leads of the package. This low temperature molding also permits molding to packages having plated leads without developing detrimental intermetallic compounds on the leads. Molding a carrier ring to the leads of a package is less expensive than attaching two sections together with an adhesive. The molding method is independent of the package material and can be used to mold structures to various types of packages and leads.

We claim:

1. A method of molding a carrier ring to leads of a semiconductor package which comprises:
   providing an assembled semiconductor package having leads;
   providing molding assembly having at least one pot wherein the pot has an irregular shaped bottom, at least one cavity for receiving the semiconductor package, and at least one runner connecting the pot to the cavity;
   placing the semiconductor package into the cavity;
   heating the molding assembly to a temperature of approximately 125 degrees centigrade;
   placing an encapsulating material having a glass transition temperature above said temperature inside the molding pot; and
   expanding the encapsulating material and the leads at substantial equal rates by maintaining the encapsulation material at said temperate while fluidizing the encapsulating material and forming a molded carrier ring on the leads.

2. The method of claim 1 wherewith providing a molding assembly step includes providing a molding pot having a bottom with a cylindric projection having sloped sides extending in a direction that is perpendicular to the bottom, a vertex of a cone shaped projection centered inside the cylindrical projection, and a slot interesting the cylindrical projection wherein the slot is aligned away from the runner of the molding assembly so that only only fluidized encapsulation material reaches the runner.

3. The method of claim 1 wherein the placing an encapsulating material step includes packing an Al$_2$O$_3$ filled novolac epoxy.

4. The method of claim 1 wherein the fluidizing the encapsulating material step include applying a pressure of appropriately nine Kg/cm$^2$ to the encapsulating material.

5. A method of attaching a carrier ring to a semiconductor package subsequent to assembly of the semiconductor package which comprises:
   providing an assembled semiconductor package having leads;

provision a molding assembly having a molding pot wherein the molding pot has an irregular shaped bottom, and having a cavity for accepting the semiconductor package;

provision an encapsulating marital;

placing the semiconductor package into the cavity;

heating the mold assembly to a temperature less than a glass transistor temperature for eh encapsulating material;

inserting the encapsulate marital into the molding pot; and applying pressure to the encapsulating material to cause a shearing action of the encapsulating meager against the irregular bottom of the pot wherein the shearing action fluidizes the encapsulating material enabling the encapsulating material to flow into the cavity and form a molded carrier ring structure on the leads of the semiconductor package while maintaining the fluidized encapsulating material at the temperature for the purpose of expanding the encapsulating material and the leads at substantial equal rates.

6. The method of claim 5 wherein the providing a semiconductor package having leads includes providing a ceramic semiconductor package, a type automated cobonding (TAB) package, or a plastic package wherein a previous molding operation formed a body for the plastic package.

7. The method of claim 5 wherein the providing an encapsulating material includes providing an $Al_2O_3$ filled novolac epoxy having a glass transition temperature of approximately 170 degrees centigrade.

8. The method of claim 5 wherein the providing a molding assembly step includes providing a molding assembly having a molding pot with an irregular shaped bottom wherein the irregular shaped bottom has a slot that permits only fluidized material to flow into the cavity.

9. The method of claim 5 wherein the providing a semiconductor package having leads includes providing a semiconductor package having leads which are plated.

10. A method of molding to semiconductor packages which comprises:

providing a molding assembly having a molding pot with an irregular bottom, and having a molding cavity;

providing an encapsulating material;

maintaining the mold assembly at a temperature that is less than a temperature required for glass transistor of the encapsulating material; and fluidizing the encapsulating material causing it to flow into the molding cavity and maintaining the fluidized encapsulation material at the temperature of the purpose f substantial matching thermal expansion rates of leads of the semiconductor package and the encapsulating material while forming a molded carrier ring structure on the leads.

11. The method of claim 10 wherein the providing a molding assembly includes providing a molding assembly having a molding pot with a bottom that has a plurality of pyramid shapes with vertexes projecting perpendicular to the bottom of the pot.

12. The method of claim 10 wherein the providing a molding assembly step includes providing a molding assembly having a molding pot having a slot that permits only fluidized material to flow into the cavity.

* * * * *

UNITED STATES PATENT AND TRADEMARK OFFICE
CERTIFICATE OF CORRECTION

Page 1 of 3

PATENT NO. : 5,182,071
DATED : January 26, 1993
INVENTOR(S) : Knapp et al.

It is certified that error appears in the above-indentified patent and that said Letters Patent is hereby corrected as shown below:

Column 4, claim 1, line 43, delete "substantial" and insert therefor --substantially--.

Column 4, claim 2, line 47, delete "wherewith" and insert therefor --wherein the--.

Column 4, claim 2, line 49, delete "cylindric" and insert therefor --cylindrical--.

Column 4, claim 2, line 53, delete "interesting" and insert therefor --intersecting--.

Column 4, claim 2, line 55, delete second occurrence "only".

Column 4, claim 2, line 55, delete "encapsulation" and insert therefor --encapsulating--.

Column 4, claim 3, line 58, delete "packing" and insert therefor --placing--.

Column 4, claim 4, line 61, delete "include" and insert therefor --includes--

Column 5, claim 5, line 1, delete "provision" and insert therefor --providing--.

Column 5, claim 5, line 5, delete "marital" and insert therefor --material--

Column 5, claim 5, line 8, delete "transistor" and insert therefor --transition--.

Column 5, claim 5, line 8, delete "eh" and insert therefor --the--.

UNITED STATES PATENT AND TRADEMARK OFFICE
CERTIFICATE OF CORRECTION

PATENT NO. : 5,182,071
DATED : January 26, 1993
INVENTOR(S) : Knapp et al.

It is certified that error appears in the above-indentified patent and that said Letters Patent is hereby corrected as shown below:

Column 5, claim 5, line 10, delete "encapsulate marital" and insert therefor --encapsulating material--.

Column 5, claim 5, line 13, delete "meager" and insert therefor --material--.

Column 5, claim 5, line 19, delete "encapsulating" and insert therefor --encapsulation--.

Column 5, claim 5, line 21, delete "substantial" and insert therefor --substantially--.

Column 5, claim 6, line 25, delete "type" and insert therefor --tape--.

Column 5, claim 6, line 26, delete "cobonding" and insert therefor --bonding--.

Column 6, claim 10, line 16, delete "transistor" and insert therefor --transition--.

Column 6, claim 10, line 20, delete "encapsulation" and insert therefor --encapsulating--.

UNITED STATES PATENT AND TRADEMARK OFFICE
CERTIFICATE OF CORRECTION

PATENT NO. : 5,182,071
DATED : January 26, 1993
INVENTOR(S) : Knapp, et. al.

It is certified that error appears in the above-indentified patent and that said Letters Patent is hereby corrected as shown below:

Column 6, claim 10, line 21, delete "f substantial" and insert therefor-- of substantially--.

Signed and Sealed this

Fourteenth Day of February, 1995

Attest:

BRUCE LEHMAN

Attesting Officer

Commissioner of Patents and Trademarks